(12) United States Patent
den Besten et al.

(10) Patent No.: US 8,811,557 B2
(45) Date of Patent: Aug. 19, 2014

(54) FREQUENCY ACQUISITION UTILIZING A TRAINING PATTERN WITH FIXED EDGE DENSITY

(75) Inventors: Gerrit Willem den Besten, Eindhoven (NL); Arnoud Pieter van der Wel, Vught (NL)

(73) Assignee: NXP B.V., Eindhoven (NL)

( * ) Notice: Subject to any disclaimer, the term of this patent is extended or adjusted under 35 U.S.C. 154(b) by 186 days.

(21) Appl. No.: 13/327,528

(22) Filed: Dec. 15, 2011

(65) Prior Publication Data

US 2012/0155589 A1 Jun. 21, 2012

(30) Foreign Application Priority Data

Dec. 17, 2010 (EP) ...................................... 10195763

(51) Int. Cl.
*H04L 7/033* (2006.01)
*H03L 7/091* (2006.01)
*H03L 7/099* (2006.01)
*H03L 7/08* (2006.01)
*H03L 7/095* (2006.01)

(52) U.S. Cl.
CPC .............. *H03L 7/091* (2013.01); *H03L 7/0995* (2013.01); *H03L 7/0807* (2013.01); *H03L 7/095* (2013.01)
USPC ............ 375/360; 375/355; 375/374; 375/375

(58) Field of Classification Search
USPC .................. 375/354, 360, 365, 355, 374, 375
See application file for complete search history.

(56) References Cited

U.S. PATENT DOCUMENTS

| 5,987,085 | A | * | 11/1999 | Anderson | 375/374 |
| 6,701,140 | B1 | | 3/2004 | Stine | |
| 7,102,446 | B1 | * | 9/2006 | Lee et al. | 331/11 |
| 8,433,000 | B2 | | 4/2013 | Den Besten | |
| 2005/0286643 | A1 | * | 12/2005 | Ozawa et al. | 375/242 |
| 2006/0034394 | A1 | | 2/2006 | Popescu et al. | |
| 2008/0112525 | A1 | * | 5/2008 | Do et al. | 375/376 |

FOREIGN PATENT DOCUMENTS

CN 101542959 A 9/2009

* cited by examiner

*Primary Examiner* — Shuwang Liu
*Assistant Examiner* — David S Huang

(57) ABSTRACT

A method for frequency acquisition comprising steps of, acquiring samples of an input signal, each sample having edges, making sets with a fixed number of consecutively taken samples, numbering the edges in each set and determining a number of edges, comparing the number of edges in each set with an expected number of edges in the sets, increasing a frequency of a reference oscillator used in acquiring samples if the actual number of edges exceeds the expected number of edges, and decreasing the frequency of the reference oscillator used in acquiring samples if the expected number of edges exceeds the actual number of edges in a set.

7 Claims, 9 Drawing Sheets

Figure 7: Example of frequency and phase behavior in frequency acquisition mode when the nominal frequency has been reached, and some mismatch exists between up and down frequency corrections

FREQUENCY ACQUISITION UTILIZING A TRAINING PATTERN WITH FIXED EDGE DENSITY

This application claims the priority under 35 U.S.C. §119 of European patent application no. 10195763.7, filed on Dec. 17, 2010, the contents of which are incorporated by reference herein.

FIELD OF THE INVENTION

The invention relates to frequency acquisition systems and a method thereon.

BACKGROUND OF THE INVENTION

For very high-speed serial data transmission typically embedded clock signaling is applied; the transmitter utilizes a certain encoding scheme to include sufficient clock information in the serialized data stream to allow the receiving side to retrieve the originally transmitted data by means of Clock and Data Recovery (CDR) and a complementary decoder.

Coding schemes may additionally provide signal conditioning like dc-balancing and/or spectral shaping. An often applied coding scheme is 8B10B, where every data byte translates into a 10-bit symbol, and that also provides control symbols, some of them including unique sequences to unambiguously determine the symbol boundaries.

The Clock and Data Recovery (CDR) function in the receiving path can be accomplished by a synchronous solution utilizing a data-tracking phase-locked loop (PLL) that is feedback-controlled to sample the center of the bits, or by an over-sampled solution which samples the input signal more than twice per bit period with a clock derived from a reference clock while the samples are processed by a digital data & clock recovery algorithm to recover the original data.

Synchronous solutions have some advantages compared to over-sampled solution, including that they recover a synchronous analog clock which can for example be used for re-transmission or for synchronous data post-processing, they typically consume less power, and they support higher data rates when implemented in a given process technology.

Disadvantages of synchronous solutions are their start-up complications, including start-up time, frequency capture range, and sensitivity to false-lock.

Data-tracking PLLs typically do not have intrinsic frequency detection capabilities, and will therefore not lock correctly without additional frequency acquisitions aids. Frequently used early-late or bang-bang data-tracking PLLs have a limited frequency capture range around the momentary free-running oscillator frequency. The frequency may drift away and/or false-lock may occur if the data rate is outside that range. This means that the oscillator frequency has to be brought close enough to the data frequency by means of additional functionality to guarantee robust operation.

A conventional solution is to add a clock-multiplier PLL loop next to the data-tracking loop in the CDR as illustrated in FIG. 1. Using a sufficiently accurate reference clock and a phase-frequency detector (PFD), the oscillator frequency is adapted to become close to the data rate, such that the data rate will be within the frequency capture range of the CDR when switching to data-tracking mode. However, this typically requires a rather accurate reference clock, which can be a major penalty if such a clock is not already present in the application for other reasons. Furthermore, special care must be taken that no significant frequency steps occur due to the switching to data-tracking mode, as otherwise the data rate may be located outside the CDR frequency capture range again.

Alternatively, a toggling training pattern can be applied to the input of the receiver for synchronization purposes. Because a data-tracking PLL typically does not have intrinsic frequency detection capabilities, usually a second loop with a phase-frequency-detector (PFD) is added, utilizing the toggling input data pattern as a reference clock signal during training, as illustrated in FIG. 2. A disadvantage of that solution is that the input signal needs to drive additional circuitry, which degrades performance due to extra parasitic loading. Furthermore, the input signal will typically be low-swing differential and is therefore most likely not capable of directly driving a logic divider or PFD. Therefore an additional amplifying buffer would be required, which needs to have a high bandwidth if the training pattern is an alternating bit sequence at the bit rate. Special care must be taken in this case too that no significant frequency steps occur due to the switching to data-tracking mode, as otherwise the data rate may become located outside the CDR frequency capture range again.

SUMMARY OF THE INVENTION

Hence, it is a need, to improve the known setbacks, at least in part.

1. It is therefore an object of the invention to provide a method for frequency acquisition comprising steps of:
   acquiring samples of an input signal, each sample having edges,
   making sets with a fixed number of consecutively taken samples,
   numbering the edges in each set and determining a number of edges,
   comparing the number of edges in each set with an expected number of edges in the sets,
   increasing a frequency of a reference oscillator used in acquiring samples if the actual number of edges exceeds the expected number of edges, and
   decreasing the frequency of the reference oscillator used in acquiring samples if the expected number of edges exceeds the actual number of edges in a set.

The method may further comprising the step of not modifying the frequency of the reference oscillator if the actual number of edges equals the expected number of edges in a set.

Additionally, it is provided a system adapted to work with the method described above, the system comprising:
   a data sampler adapted to receive a serial input data signal, and generating a plurality of bits for each cycle of a clock signal which samples the data sampler,
   a first phase-frequency detector adapted to extract a frequency information from the incoming serial input data signal,
   an edge counter for generating an edge count number obtained from the serial input data signal,
   a comparator means for comparing the edge count number with a preset number, the comparator generating a signal for controlling a first charge pump, the charge pump generating in turn a charge pump signal for controlling a voltage controlled oscillator, the voltage control oscillator being further controlled by a second signal generated by a second charge pump, the second charge pump being controlled by a signal generated by the data sampler.

Advantageously the serial input signal comprises a predefined repetitive pattern, a length of the predefined repetitive pattern corresponding to the number of bits covered in each sample set.

Furthermore, in a data lock condition, at least two samples per bit are considered, the system further using only a subset of the acquired samples for frequency acquisition.

The invention is defined by the independent claims. Dependent claims define advantageous embodiments.

BRIEF DESCRIPTION OF THE DRAWINGS

The above and other advantages will be apparent from the exemplary description of the accompanying drawings in which.

DETAILED DESCRIPTION OF EMBODIMENTS

This invention proposes a clock and data recovery architecture which is capable of doing frequency acquisition, without the need for an accurate reference clock and without additional circuitry connected to the input, if there is a training pattern with a known edge density present on the input.

Figure 1:
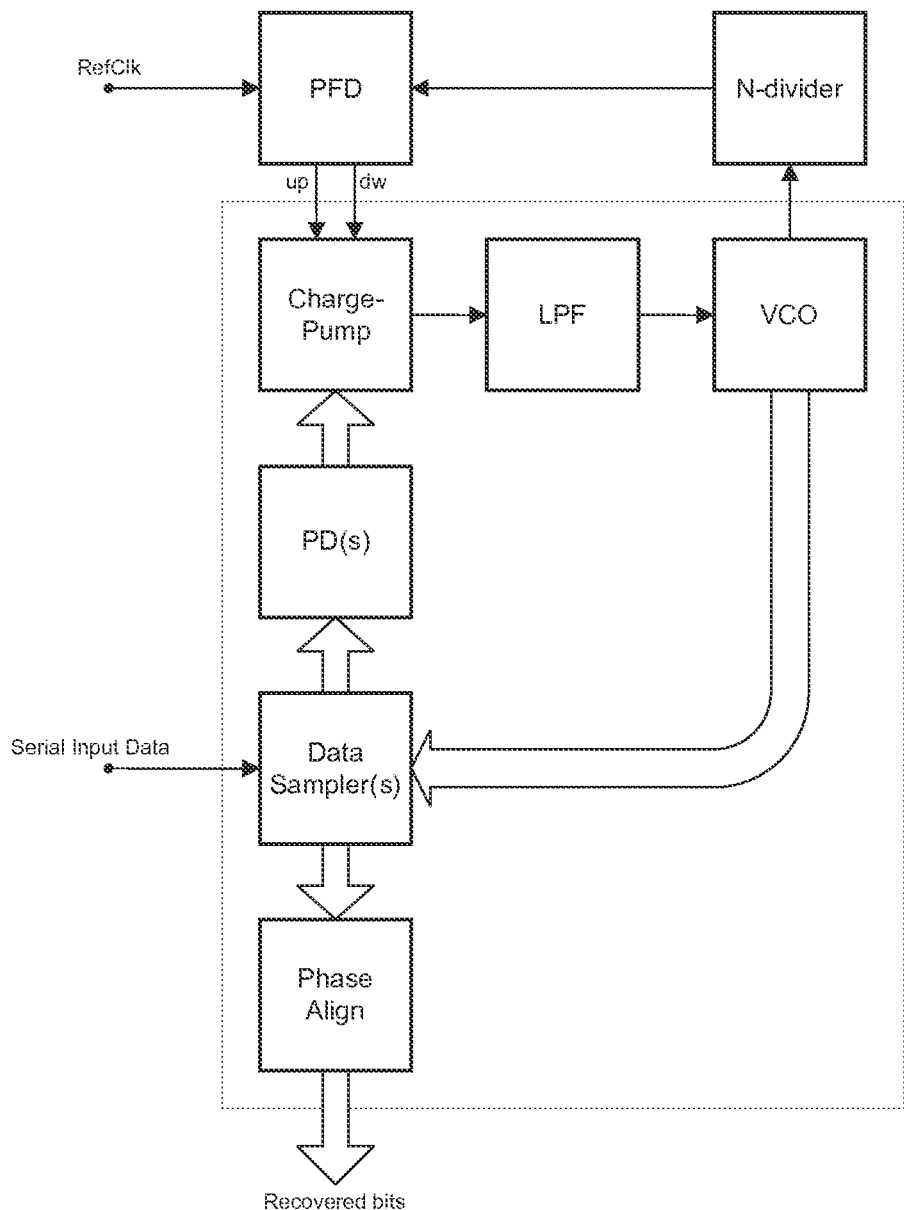
FIG. 1: Depicts a data-tracking CDR architecture with additional PFD loop for frequency acquisition utilizing a reference clock.
Figure 2:
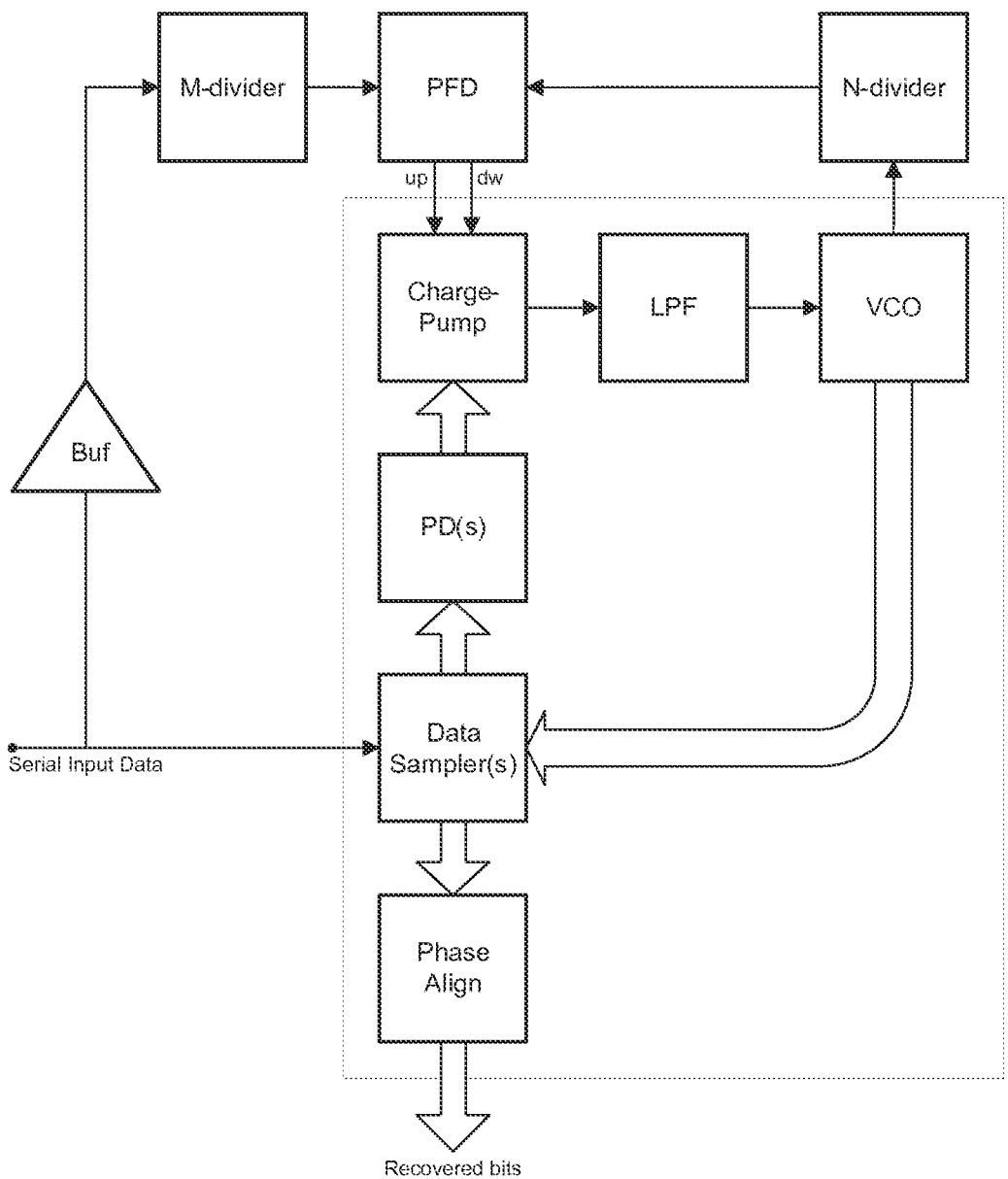
FIG. 2: Depicts a data-tracking CDR architecture with additional PFD loop for frequency acquisition utilizing a alternating training data pattern.
Figure 3:
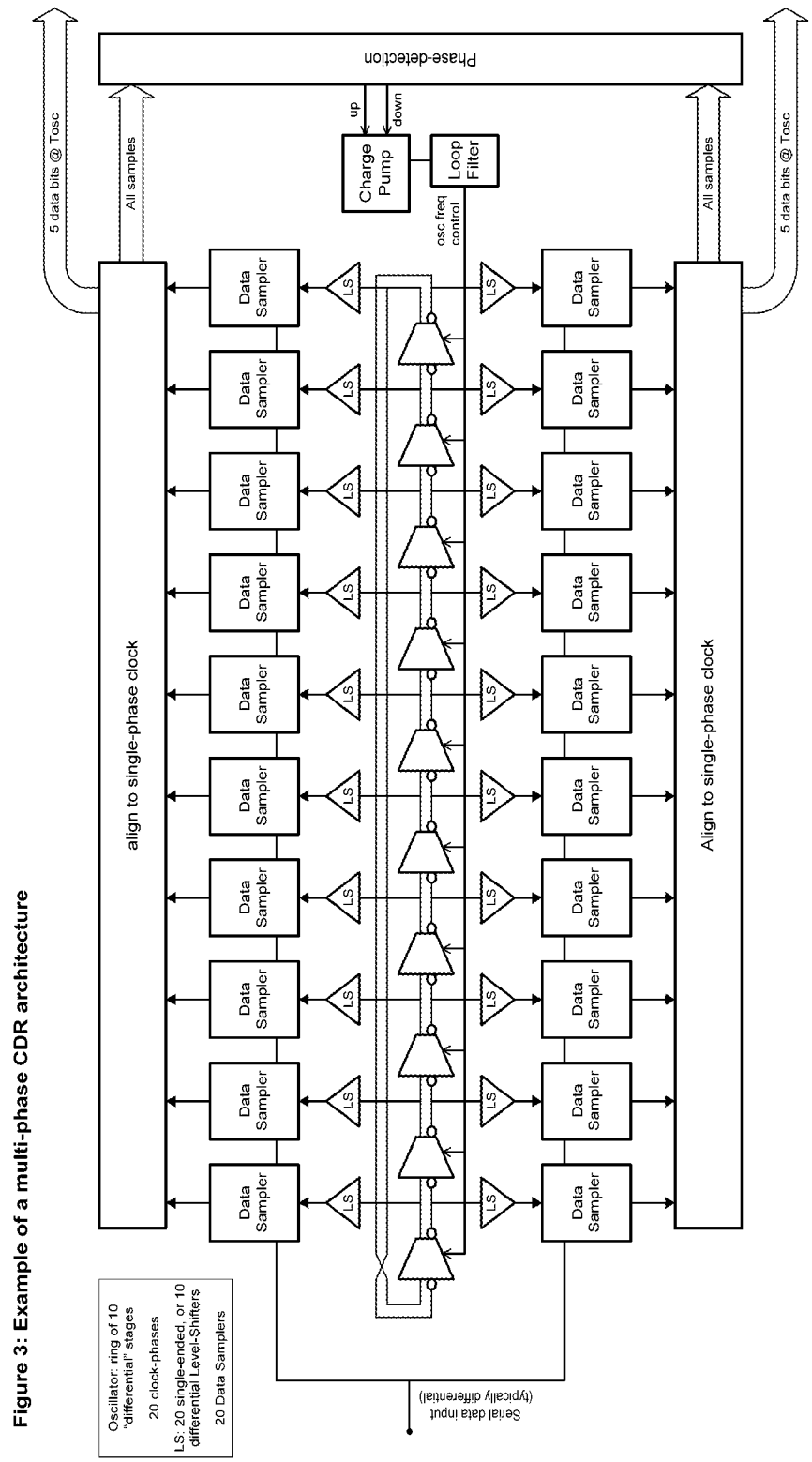
FIG. 3: Depicts a multi-phase CDR architecture.

The frequency acquisition method according to this invention re-uses the same data sampling front-end as needed for data-tracking mode to acquire samples. An example of such an architecture that is suitable for that is shown in FIG. 3. The resulting samples are post-processed to derive information about the oscillator frequency with respect to the data rate of the input sequence. This information is then used to control the oscillator to the correct frequency. For example, the post-processing of samples can be executed in sets of K samples to determine the number of edges in each set. Comparison of the actual edge count with a reference edge count value, leads to a decision whether the frequency is too high, too low, or good enough. This decision can be used to correct the oscillator frequency, for example by means of a charge pump.

Note that it can be advantageous to choose the number K to be an integer times the targeted number of samples per bit, when the loop is locked. Furthermore, for multi-phase CDR architectures, it may be advantageous to let the number K match with the number of parallel clock-phases and samplers, such that the digital processing can be done at the aligned sets of samples at the oscillator clock frequency.

Figure 4:
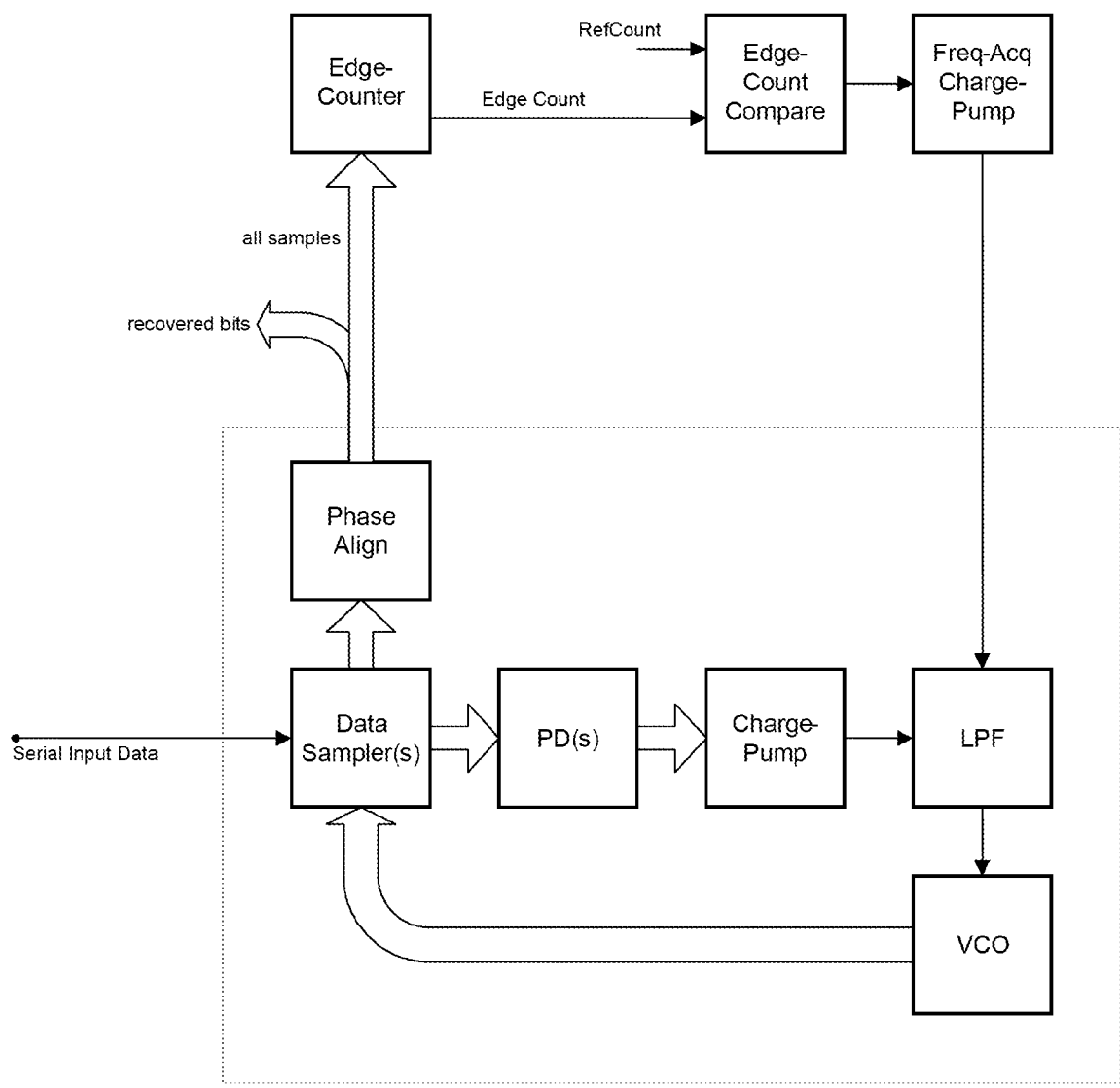
FIG. 4: Depicts a data-tracking CDR architecture with in-line frequency acquisition using a fixed edge density training data pattern.

An example of such a case is illustrated in FIG. 4. Consider for example, the case with an alternating bit sequence as training pattern on the input of a CDR comprising a multi-phase sampling front-end architecture with 2N-phases, targeted to operate with 2 samples per bit period, when locked correctly. This is a very typical situation as alternating bit patterns are used in practice for training, and taking 2 samples per bit period is optimum for achieving the highest data rates with a synchronous data-tracking clock and data recovery circuit.

In that case, 2N consecutive samples should contain N zeroes and N ones. This also implies that there will typically be N logic transitions within a sample set, taking into account that the first transition may be located between the first sample of this set and the last sample of the previous set. The edges can be detected with EXOR functions across any 2 neighboring samples, corresponding to 2N positions within 2N+1 samples. The number of detected edges can be counted and compared with the expected number of edges N.

When the oscillator frequency is too low compared to the data rate, the sampling front-end will take effectively less than 2 samples per input data bit and therefore the number of detected edges within 2N+1 samples will become higher than N, which can be used as a trigger to increase the oscillator frequency.

When the oscillator frequency is too high compared to the data rate, the sampling front-end will take effectively more than 2 samples per input data bit and therefore the number of detected edges within the 2N+1 samples will become lower than expected number of edges N, which can be used as a trigger to decrease the oscillator frequency.

Figure 5:
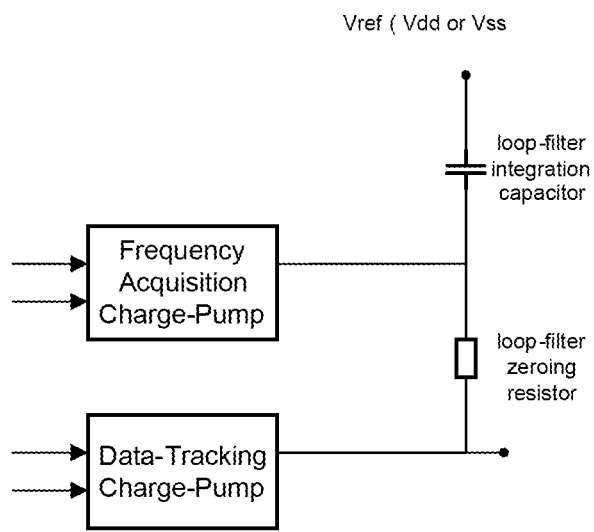
FIG. 5: Depicts an embodiment of a loop-filter.

Note that instead of connecting the output of the frequency acquisition charge-pump directly to the oscillator frequency control voltage, it may be advantageous to connect it to the integration capacitor of the loop filter only, as shown in FIG. 5. This takes the zero in the loop-filter out of the frequency acquisition loop, which would otherwise cause undesirable frequency jumps. The frequency acquisition loop can be stable without zero in the loop-filter, because the edge-count comparison principle results in a measure of frequency and therefore the loop shows first-order loop characteristics.

During frequency acquisition the loop is not yet in phase-lock and the phase of the samples can therefore move with respect to the input data edges. Furthermore it should be noted that the edges of the input signal and the clock edges are influenced by jitter. Therefore in frequency acquisition mode, even when the frequency has become nominally correct, some edges may move into the previous or next set, which will result in a too high or too low edge count of a set. However, due to fact that all edges are counted, a set with a too low edge count will always be later on followed by a set with a too high edge count, when the frequency is correct. Therefore these decision errors average out and the loop drives the oscillator frequency to the correct value. Note that there will be a small limit cycle, because of the fact that this is a frequency-only feedback loop, which does not maintain stable phase-lock.

It should be noted that the described method of counting edges to determine whether the oscillator frequency is too high or too low with respect to the input data rate, does not work for all possible frequencies. For an architecture operated with 2 samples per bit, it works in the ideal case if the oscillator frequency is between one-third and two times of what it should be. In practice it might become a bit less due to non-idealities. Fortunately, the capture range of the frequency acquisition loop is very large, but still the frequency needs to be brought within that range.

Figure 6:
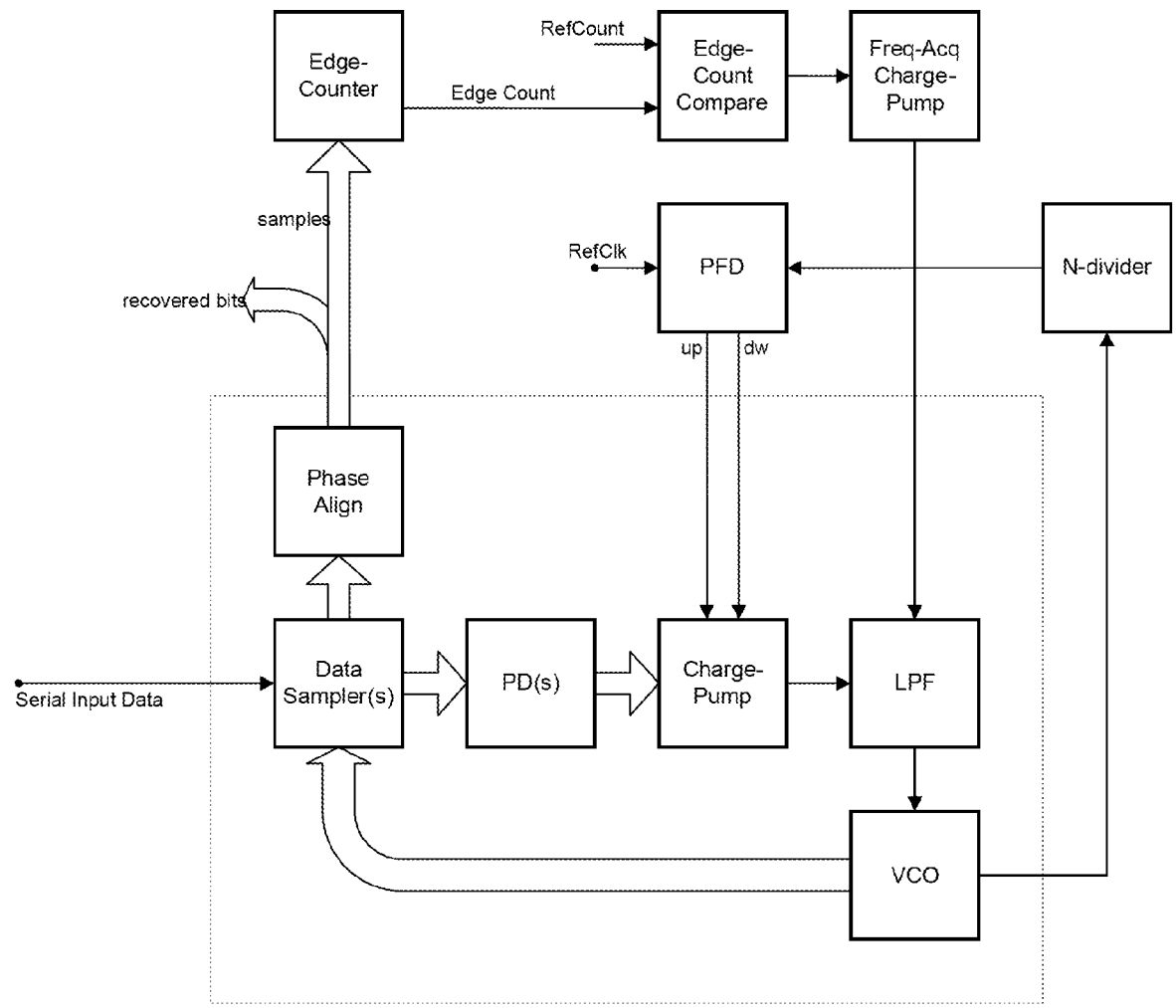
FIG. 6: Depicts an example of data-tracking CDR architecture with in-line frequency acquisition utilizing a alternating training data pattern and an additional PFD loop for rough frequency positioning.

This can for example be achieved by extending the architecture with an additional PFD loop with a reference clock input, that doesn't have to be accurate, which is illustrated in FIG. 6. This low-accuracy reference clock can be easily generated by many types of oscillators, and therefore has no cost penalty. Alternatively the integrator node of the loop-filter may be pre-charged such that the oscillator frequency is within the frequency acquisition capture range.

This makes that start-up of the data-tracking CDR takes three phases.
1. Bring the oscillator frequency within the wide capture range of the frequency acquisition loop, for example by means of a PFD loop using a low-cost integrated oscillator as reference
2. Bring the oscillator frequency accurately to frequency corresponding with the data rate by means of the frequency acquisition loop
3. Switch over to data-tracking mode Note that switching over from step 2 to step 3 can be very smooth as the same sampling front-end is being used. The main difference is that the oscillator frequency becomes controlled by the results of phase-detectors instead of by the edge-count comparison.

It may be beneficial to move to a lower frequency than the final target frequency in the first phase to avoid that the oscillator is pushed to run at a higher frequency than the maximum needed for the application.

If the frequency is within the capture range, and the difference between actual and target frequency is large, the loop almost continuously corrects the oscillator frequency because every sample set will show an incorrect edge count. When the frequency becomes closer to the target frequency, some sets of samples that will show a correct edge count, which makes that the correction does not happen every sample set cycle anymore. The relative number of frequency correction pulses decreases until the frequency closely approaches the target frequency. Note that some frequency correction pulses will continue to happen around the target frequency.

Figure 7:
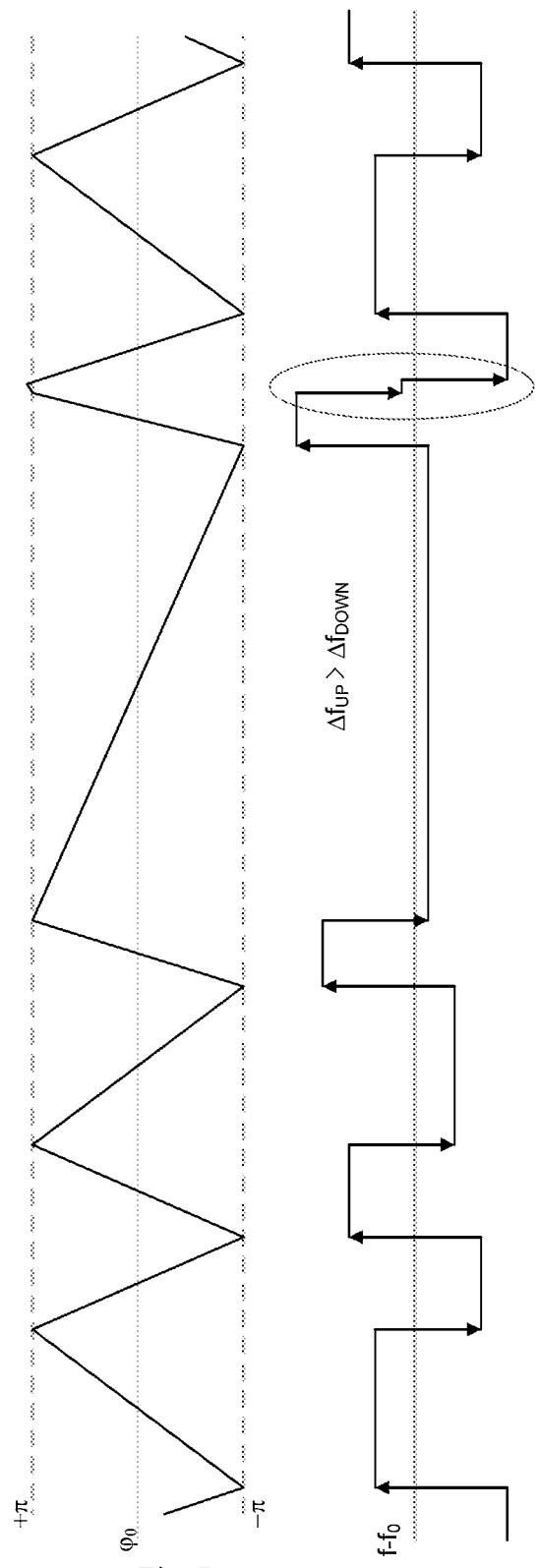
FIG. 7: Depicts frequency and phase behaviors in frequency acquisition mode when the nominal frequency has been reached, and some mismatch exists between up and down frequency corrections.

FIG. 7 shows an example of possible behavior of frequency and phase when the frequency acquisition has settled. The frequency is corrected in discrete steps, so it will never be exactly correct. During some periods of time the frequency is slightly too high, and during some periods of time the frequency is slightly too low. During those periods, the edge count remains correct while the phase drifts but the edge positions have not moved yet, so nothing is detected. If the frequency is slightly too high, there will be too few edges in a set at some moment in time. When that is detected the frequency is corrected by a downward step, after which the frequency typically becomes slightly too low. In that case there will be too many edges in a set at some moment in time, resulting into a frequency correction upwards, after which the mechanism repeats itself. If the frequency correction upward and downward step are equal and no other non-idealities are involved this results in a frequency toggling between two values: one above and one below the target frequency.

In practice there will be other non-idealities that influence the behavior, like for example mismatch between upward and downward frequency correction steps, leakage, and drift. The impact of these is that the frequency has a preferred tendency in one direction. Frequency correction step mismatches can easily occur for example due to imperfect matching of charge-pump up/down currents. The impact of such a frequency step mismatch is illustrated in FIG. 7. The consequence of this is that there will, sometimes, be two decisions in a row into the same direction.

It may be advantageous for a system to know when frequency acquisition is complete and switching-over to data-tracking mode is possible. Typically, if frequency acquisition is complete, many sample sets will show the correct number of edges, but some sets will still show a too high or too low edge-count resulting in frequency up and down correction. Up and down corrections will ideally be alternating events with or without no-correction cycles in between them. As explained above, in practice, sometimes two upward or two downward corrections can occur in a row, again possibly with no-correction cycles in between them. All other situations can be considered as not-settled.

Figure 8:
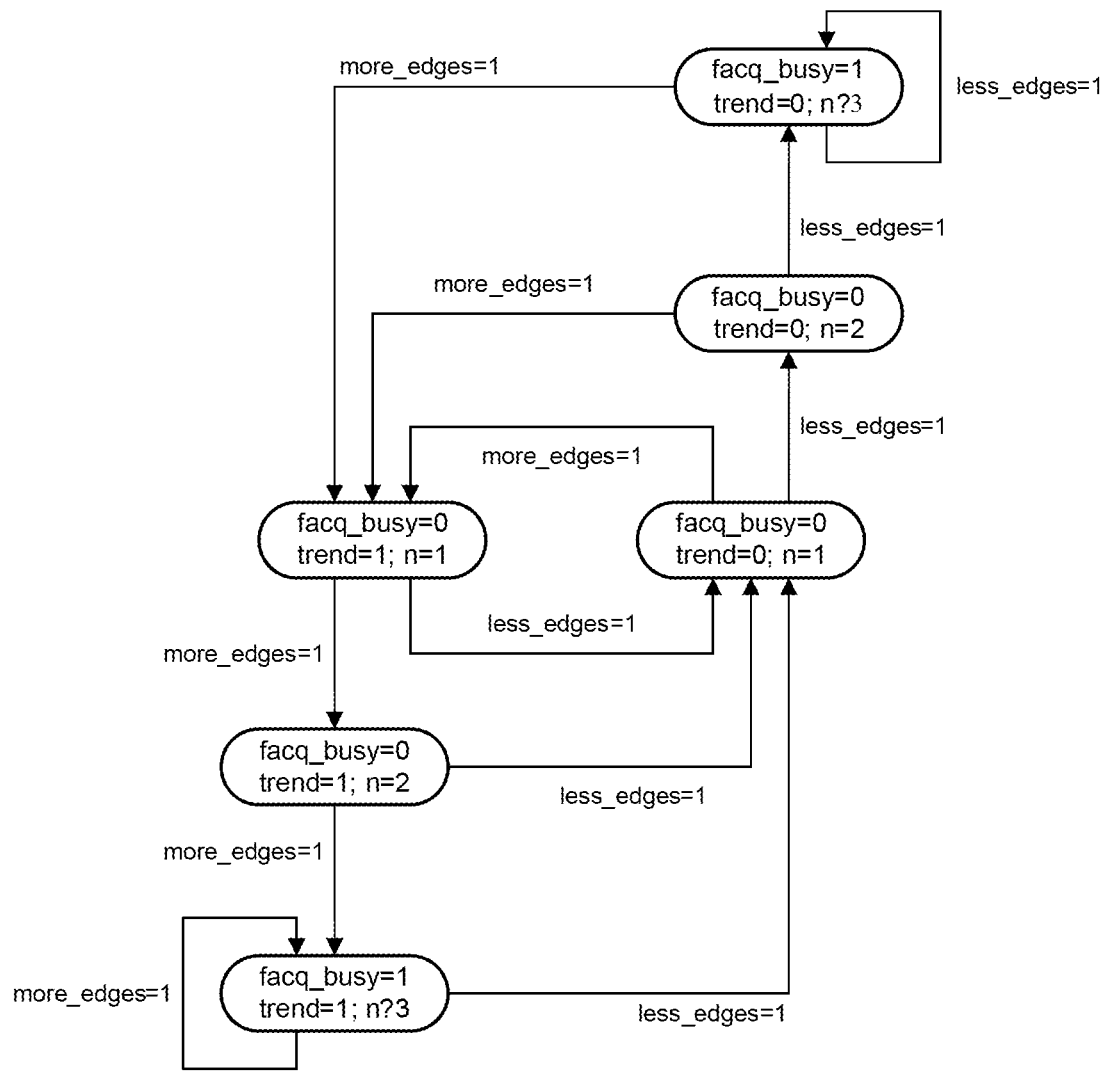
FIG. 8: Depicts an exemplary state-machine to detect if frequency acquisition is ready or busy.
Figure 9:
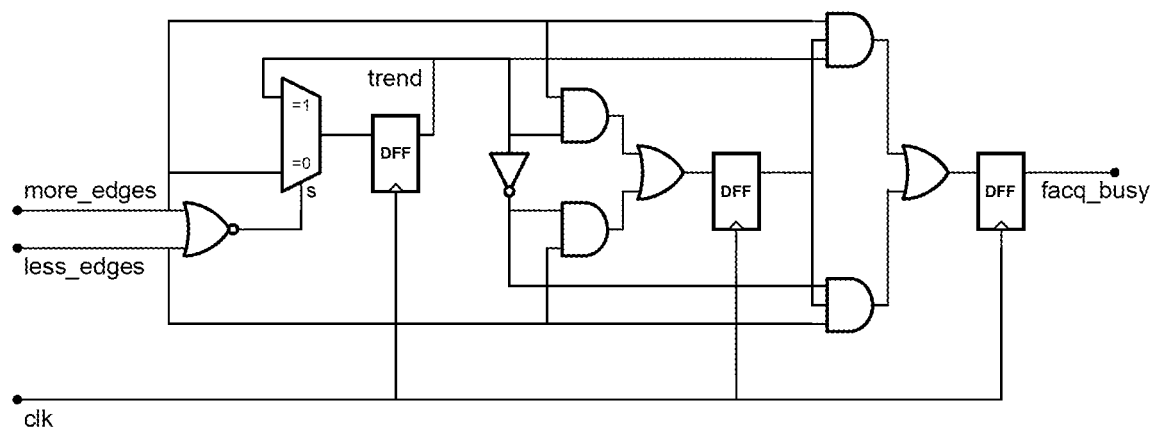
FIG. 9: Depicts an exemplary implementation for a detector that determines when frequency acquisition is busy.

These conditions can for example be checked with a state-machine as shown in FIG. 8. In FIGS. 8 and 9, more_edge is an indication that the edge-count of a sample set is too high, while less_edge is an indication that the edge-count of the sample set is too low. All no-correction cycles are ignored, so only the sequence of decisions that correct the frequency is used. This state-machine watches the trend if more or less edges are observed. If three or more decisions in a row are indicating the same direction, the facq_busy signal is asserted in order to indicate that the frequency acquisition is not completed. The system can monitor this signal until it remains silent for a certain period of time. Note that the facq_busy signal as described here does not provide a constant busy indication while the frequency settles, so a certain time-out would be desirable. Because the facq_busy can be a rather high frequency pulsed signal, it may be advantageous to use a flip-flop which is asynchronously set by the facq_busy signal to capture a busy indication, while the system used periodic a clear-of-read to check the status.

FIG. 9 shows an example implementation of the state-machine shown in FIG. 8. Although a toggling input data pattern has the advantage that it contains the maximum number of edges, it is also possible to apply the invented frequency acquisition concept in case of other patterns.

Any training pattern with a fixed edge density can be used too, where fixed edge density means that the number of edges within a time-slot of given fixed length is constant, independent of the beginning and ending moment of the time-slot. It is beneficial if the size of the sample sets corresponds with the length of the given fixed time-slot, as in that case the number of edges per set becomes constant. For example, if the chosen sample sets are targeted to correspond with 10 bits then any repeated 10 bit sequence can work, as its edge density is known and the sample sets can be compared with that. Because 10-bit symbol coding schemes are often used, this granularity has significant benefits.

Furthermore, even a training pattern that has a known average edge density over a longer period of time can be used if the time constant of the frequency acquisition control loop can be made sufficiently large compared to the period over which the edge density of the training pattern becomes substantially constant.

Note that if in a certain architecture the targeted number of samples per bit is larger than 2, a sub-set of all samples may be sufficient for frequency acquisition.

Note that the settling time can be improved by using large frequency correction steps, but this is at the expense of final settling accuracy. Oppositely settling accuracy can be improved by reducing the frequency correction steps, but this is at the expense of slower setting. It is possible to combine the benefits by adapting the frequency correction step during the settling, such that larger step are used initially to settle fast while the frequency step is reduced towards the end of the frequency acquisition period in order to achieve better final settling accuracy.

The controlled oscillator inside a CDR has been depicted in figures as a Voltage-Controlled Oscillator (VCO) for comprehensibility reasons, but alternative types of controlled oscillators may be used as well, for example a Current-Controlled Oscillator (CCO). Note that this may also impact the required construction of the loop-filter. Nevertheless, an alternative loop-filter will typically also include an integration capacitor, so a similar frequency acquisition loop can be used.

All figures are meant as examples and are not limiting the scope of this invention. Although in the architectural descriptions charge-pump based frequency control has been used, this should be considered as just an example of how this can be done and is therefore not limiting the invention. Any other ways to translate decisions that the frequency must be increased or decreased into the desired change of frequency can be applied instead too.

Note that for any of the example circuit embodiments, it may be advantageous in practice to apply complementary implementations, or different implementations with similar functionality.

Note that specific choices for logic high or low levels for certain signals in this document are all examples to illustrate the principle, and are not limiting the scope.

Note that although this invention is particularly suitable for application in integrated circuits, it may also be applied for systems where the part according to this invention includes multiple components.

It is remarked that the scope of protection of the invention is not restricted to the embodiments described herein. Neither is the scope of protection of the invention restricted by the reference numerals in the claims The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A method for frequency acquisition, comprising steps of:
   acquiring samples of an input signal, each sample having edges,
   making sets with a fixed number of consecutively taken samples,
   numbering the edges in each set and determining a number of edges,
   comparing the number of edges in each set with an expected number of edges in the sets,
   increasing a frequency of a reference oscillator used in acquiring samples if the actual number of edges exceeds the expected number of edges, and
   decreasing the frequency of the reference oscillator used in acquiring samples if the expected number of edges exceeds the actual number of edges in a set.

2. A method for frequency acquisition as claimed in claim 1, further comprising the step of not modifying the frequency of the reference oscillator if the actual number of edges equals the expected number of edges in a set.

3. A system for frequency acquisition, comprising:
   a data sampler adapted to receive a serial input data signal, and generate, as an output signal, a sample set of a plurality of bits for each cycle of a clock signal which samples the data sampler,
   a first phase-frequency detector adapted to extract a frequency information from the incoming serial input data signal,
   an edge counter for generating an edge count number obtained from the serial input data signal,
   a comparator that compares the edge count number obtained from the serial input data, with a preset number,
   the comparator generating a signal for controlling a first charge pump, the charge pump generating in turn a charge pump signal for controlling a voltage controlled oscillator, the voltage control oscillator being further controlled by a second signal generated by a second charge pump, the second charge pump being controlled by the output signal generated by the data sampler and an output of the phase frequency detector.

4. A system as claimed in claim 3, wherein the serial input signal comprises a predefined repetitive pattern, a length of the predefined repetitive pattern corresponding to a number of bits covered in each sample set.

5. A system as claimed in claim 3, wherein, in a data lock condition, at least two samples per bit are considered, the system further using only a subset of the sample set for frequency acquisition.

6. A system for frequency acquisition, comprising:
   a data sampler adapted to receive a serial input data signal, and generate, as an output signal, a sample set of a plurality of bits for each cycle of a clock signal which samples the data sampler,
   a first phase-frequency detector adapted to extract a frequency information from the incoming serial input data signal,
   an edge counter for generating an edge count number obtained from the serial input data signal,
   a comparator that compares the edge count number obtained from the serial input data, with a preset number,
   the comparator generating a signal for controlling a first charge pump, the charge pump generating in turn a charge pump signal for controlling a voltage controlled oscillator, the voltage control oscillator being further controlled by a second signal generated by a second charge pump, the second charge pump being controlled by the signal generated by the data sampler and an output of the phase frequency detector; and
   wherein, in a data lock condition, at least two samples per bit are considered, the system further using only a subset of the sample set for frequency acquisition.

7. The system as claimed in claim 6, wherein the serial input signal comprises a predefined repetitive pattern, a length of the predefined repetitive pattern corresponding to a number of bits covered in each sample set.

* * * * *